(12) United States Patent
Fredrickson et al.

(10) Patent No.: US 7,117,425 B2
(45) Date of Patent: Oct. 3, 2006

(54) DECODER ARCHITECTURE FOR REED SOLOMON CODES

(75) Inventors: Lisa Fredrickson, Long Beach, CA (US); Leilei Song, Red Bank, NJ (US)

(73) Assignee: Agere Systems Inc., Allentown, PA (US)

( * ) Notice: Subject to any disclaimer, the term of this patent is extended or adjusted under 35 U.S.C. 154(b) by 414 days.

(21) Appl. No.: 10/251,776

(22) Filed: Sep. 23, 2002

(65) Prior Publication Data

US 2004/0059990 A1    Mar. 25, 2004

(51) Int. Cl.
*H03M 13/00* (2006.01)

(52) U.S. Cl. .................................. 714/785
(58) Field of Classification Search .......... 714/785
See application file for complete search history.

(56) References Cited

U.S. PATENT DOCUMENTS 6,119,262 A * 9/2000 Chang et al. ............. 714/781

OTHER PUBLICATIONS

Yu-xin et al., Design and implementation of high speed Reed Solomon decoders, Jun. 2002, IEEE, p. 146-149.*
Choomchuary et al., Tine domain algorithm and architectures for Reed Solomon decoding, Jun. 1993, IEEE Proceedings-1, vol. 140, No. 3, p. 189-196.*
Arambepola et al., VLSI array architecture for Reed Solomon decoding, Nov. 1991, IEEE, p. 2963-2966.*
Elwyn Belekamp, Algebraic Coding Theory, 1968.
J.L. Massey, Shift Register Synthesis and BCH Coding, IEEE Transactions on Information Theory, vol. IT-15, No. 1, 1969, pp. 122-127.
Toshio Horiguchi, High Speed Coding of BCH Codes Using a New Error—Evaluation Algorithm, Electronics and Communications in Japan, Part 3, vol. 72, No. 12, 1989.
Weishi Feng, On Decoding Reed-Solomon Codes up to and Beyond the Packing Radii, P.H.D. Thesis, University of Illinois at Urbana-Champaign, 1999.

* cited by examiner

*Primary Examiner*—Shelly Chase (57) ABSTRACT

A Reed Solomon decoder architecture that uses a modified version of the error-evaluator polynomial form having a significantly reduced area of the dominant PDU unit, without loss in iteration time, in slice circuitry, which rotates terms to share a common multiplier and other circuitry. In addition, a B polynomial is stored, and associated overflow flags are implemented, to allow its storage to be minimized using a dual-multiplier arrangement. The decoder for error correcting codes comprises a syndrome calculation circuit, and a polynomial determining unit comprising slices, and a single multiplier in each of the slices, wherein each of the slices is employed a plurality of times in successive clock cycles. A correction circuit comprises a first multiplier employed when a scratch polynomial has overflowed, and a second multiplier employed when not overflowed.

15 Claims, 10 Drawing Sheets

DECODER ARCHITECTURE FOR REED SOLOMON CODES

BACKGROUND OF THE INVENTION

1. Field of the Invention

The invention relates to an architecture for a Reed Soloman decoder with improved efficiency.

2. Background

Reed Soloman codes are error-correcting codes used to improve the robustness of communication and storage systems. A data stream, consisting of k m-bit symbols, is typically protected against errors by appending r m-bit redundant symbols, so that the concatenated stream of n=k+r m-bit symbols forms a Reed Solomon codeword. Some symbols of the transmitted or stored codeword may be erroneous when recovered, and if the number of erroneous symbols is small enough, they can be found and corrected by a Reed Solomon decoder.

In some systems, the recovery circuitry generates a measure of each symbol's reliability as the recovered symbols are produced. If a symbol is regarded as unreliable, an erasure flag is generated to indicate its location to the Reed Solomon decoder. If s flagged and t unflagged erroneous symbols are recovered, a Reed Solomon decoder designed to process these erasure flags is capable of correcting the errors if 2t+s<=r . We refer to such a decoder as an error-and-erasure decoder.

In other systems the recovery circuitry does not process erasure flags, and such a decoder is therefore referred to as an error-only decoder. If t erroneous symbols (i.e., t errors) are recovered, an error-only Reed Solomon decoder is capable of correcting the errors if 2t<=r.

A typical Reed-Solomon error-correction system utilizes an encoder and decoder. The encoder inputs the k data symbols and appends the r redundant symbols in such a manner that the n symbols of a Reed-Solomon codeword can be regarded a the coefficients of a polynomial of degree n−1, which is a multiple of a generator polynomial of degree r−1. The roots of the generator polynomial are consecutive powers of a so-called primitive element, as it is commonly known in the literature, which is commonly referred to as α. These roots are $$\{\alpha^{Ir0}, \alpha^{Ir0+1}, \alpha^{Ir0+2}, \ldots, \alpha^{Ir0+r-1}\},$$

where Ir0 is an arbitrary logarithm in base α of the first root. In transmission or storage, some of the codeword symbols may be corrupted when received at the decoder.

A typical decoder architecture consists of three processing units. The first is referred to here as a syndromer, whose purpose is to calculate the so-called syndromes, as they are known in the literature, from the received vector. The syndromes are the coefficients of the Fourier transform of an error vector that the syndromer computes from the received vector. The syndromer typically requires one clock cycle per recovered symbol. The second is referred to here as a polynomial determining unit (PDU), and typically dominates the VLSI area of the decoder. The PDU determines various polynomials from the syndromes, depending upon the algorithm employed, including an error locator polynomial. The third processing unit is referred to here as a Chien searcher, which also typically requires one clock cycle per recovered symbol. The function of the Chien searcher is to find roots of the error locator polynomial, in order to locate the errors.

For high throughput, a PDU architecture is desired which can process a Reed Solomon codeword within a number of clock cycles equal to the number of symbols in a codeword, n. Early Reed-Solomon decoders utilized a single centralized Galois Field multiplier as part of a specialized arithmetic logic unit to perform the PDU functions. In this case, the problem of determining the polynomials from the syndromes is proportional in multiplications to the square of t, denoted $O(t2)$, where t is the number of errors to be corrected. However, as the maximum number of errors, tmax, to be corrected has grown, the number of clock cycles to perform the PDU functions in these early implementations has exceeded n. Therefore, the focus today is on PDU architectures which utilize $O(t)$ parallel multipliers and require $O(t)$ clock cycles to determine the polynomials.

Berlekamp and Massey described algorithms for decoding Reed Solomon codes by determining certain polynomials. Although these algorithms have been slightly refined over time, they are still generally referred to in the literature as the Berlekamp-Massey algorithm. Typical implementations of the Berlekamp-Massey algorithm use the syndromes to determine an error locator polynomial, $\Lambda(z)$, and an error evaluator polynomial, $\Omega(z)$. As described by Berlekamp, the calculation of these two polynomials uses two additional scratch polynomials, $A(z)$ and $B(z)$. Each of the polynomials is approximately of degree t.

Later, Blahut described a method of determining $\Lambda(z)$ from the syndromes using only the scratch polynomial $B(z)$. $\Omega(z)$ was then determined in an additional step, convolving the syndrome polynomial $S(z)$ with the locator polynomial, i.e., $\Omega(z)=S(z)\cdot\Lambda(z)$. Further, Horiguchi showed that it is not necessary to determine the polynomial $\Omega(z)$; the errors can be directly determined from $\Lambda(z)$ and one of the scratch polynomials used to produce it, $B(z)$. Berlekamp's storage of two polynomials or Blahut's additional convolution can be eliminated to increase efficiency.

Feng revised Horiguchi's algorithm to make it more regular and suitable for VLSI implementation. To achieve this, Feng reformulated the algorithm and used a special circuit to calculate a scaling factor, Bp. This was done to prevent an overflow in the scratch polynomial $B(z)$. An advantage of Feng's architecture is that the storage for iterative development of various polynomials is minimized, where the total storage is r m-bit registers used to hold the syndromes, tm-bit registers used to hold iterative solutions for $\Lambda(z)$, and t m-bit registers used to hold iterative solutions for $B(z)$, for a total of approximately 4tm registers in the polynomial determination unit. A disadvantage of Feng's architecture is that it uses 3t multipliers, and these multipliers dominate the VLSI area of the PDU.

Fredrickson described a PDU architecture which used approximately 2t multipliers in a shared fashion for reduced area while retaining approximately the same iteration time as Feng. The overall area and hence efficiency was improved, but the storage requirements for polynomials was larger than in Feng's architecture.

SUMMARY OF THE INVENTION

In accordance with the principles of the present invention, a decoder for error correcting codes comprises a syndrome calculation circuit. A polynomial determining unit calculates polynomials from an output of the syndrome calculation circuit. The polynomials include at least one polynomial that is rotated if the one polynomial overflows.

A correction circuit for a decoder for error correcting codes in accordance with another aspect of the present invention comprises a correction circuit to evaluate an error evaluation polynomial. The correction circuit comprises a first multiplier employed when a scratch polynomial has overflowed, and a second multiplier different from the first multiplier employed when the scratch polynomial has not overflowed.

A method of decoding error correcting codes in accordance with yet another aspect of the present invention comprises calculating a plurality of syndromes. A plurality of polynomials are calculated from the calculated plurality of syndromes. At least one of the calculated plurality of polynomials is rotated if the polynomial overflows.

A method of correcting errors for decoding error correcting codes in accordance with still another aspect of the present invention comprises calculating an error evaluation polynomial comprising a plurality of coefficients. Each of the plurality of coefficients of the error evaluation polynomial is multiplied by a first factor if each coefficient has overflowed. Each of the plurality of coefficients of the error evaluation polynomial is multiplied by a second factor different from the first factor if each coefficient has not overflowed, whereby the error evaluation polynomial is evaluated.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

In accordance with the principles of the present invention, a highly efficient PDU architecture is provided which uses a total of t multipliers in a shared fashion for reduced area while retaining approximately the same iteration time and polynomial storage efficiency of Feng. This is achieved by sharing a single multiplier in each 'slice' of the circuit and employing it three times in successive clock cycles.

In addition, a proprietary alternative to Feng's scaling factor circuitry is disclosed which incorporates rotation of the scratch polynomial $B(z)$ when $B(z)$ overflows, and employs a modified Chien searcher with specialized dual constant multipliers to multiply by two different factors according to whether or not $B(z)$ has overflowed, to eliminate the determination of the scaling factor Bp.

In a preferred embodiment of the invention, the described architecture does not process erasure flags, and is therefore an error-only decoder. If t erroneous symbols (i.e., t errors) are recovered, the disclosed Reed Solomon decoder is capable of correcting the errors if $2t<=r$. However, the architecture disclosed here is easily extended to an error-and-erasure decoder with improved efficiency, combining the methods of the disclosed architecture with erasure locator polynomial pre-processing methods that are well-known in the art.

Figure 1:
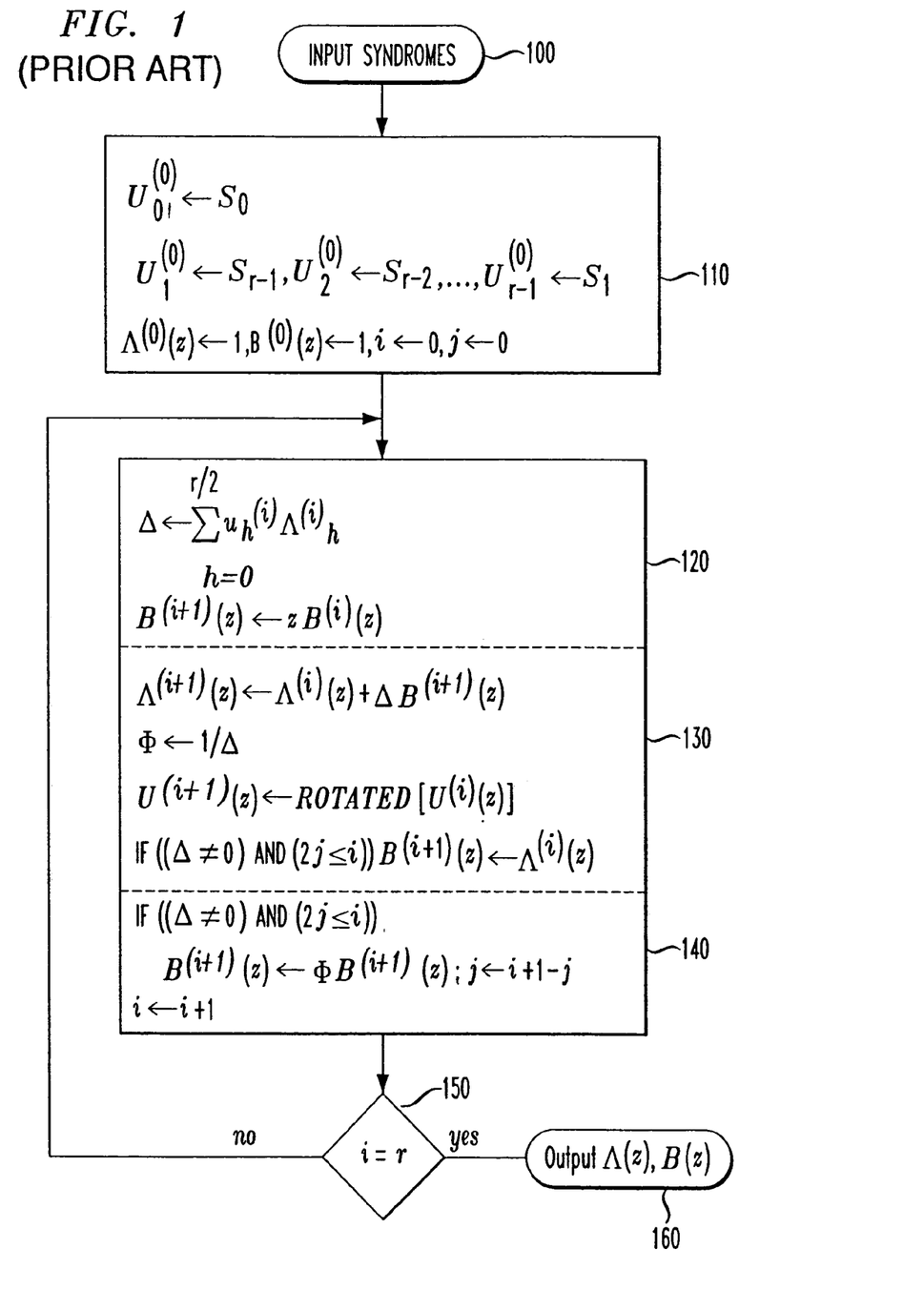
FIG. 1 shows a part of the Berlekamp-Massey algorithm used to determine a locator polynomial according to the background art.

The Berlekamp-Massey algorithm, as discussed in the Background of the Invention, for determining polynomials $\Lambda(z)$ and $B(z)$ from the syndromes is shown as a flowchart here for reference in FIG. 1. In step 100 the syndromes are input, and in step 110 the coefficients are updated. In FIG. 1, it is convenient to use polynomial notation for a stored sequence of coefficients, $\{A_0, A_1, A_2, \ldots\}$ where $$A(z) = \Sigma A_i z^i$$

In FIG. 1, $U(z)$ is a sequence of r rearranged syndrome coefficients, while $\Lambda$ is of degree $t_{max}$ and B is of degree r+1. The notation $$B^{(i+1)}(z) \leftarrow zB^i(z)$$

indicates that the B coefficients are updated in a shifting operation, $$B_0^{(i+1)}=0, B_1^{(i+1)}=B_0^i, B_2^{(i+1)}=B_1^i, \ldots, B_r^{(i+1)}=B_{(r-1)}^i$$

and the notation $$U^{(i+1)}(z) \leftarrow \text{ROTATED } [U^i(z)]$$

indicates that the U coefficients are updated in a shifting operation, with the highest degree coefficient shifting to the lowest degree, $$U_0^{(i+1)} = U_{(r-1)}^{(i)}, U_1^{(i+1)} = U_0^{(i)}, U_2^{(i+1)} = U_1^{(i)}, \ldots, U_{(r-1)}^{(i+1)} = U_{(r-2)}^{(i)}$$

In FIG. 1, i is used to count the r iterations of the algorithm. Assume that at most t errors have occurred. The body of each iteration is subdivided into three steps 120, 130 and 140.

In step 120, the outputs of $t_{max}$ multipliers, which scale coefficients of the current $\Lambda^j(z)$ by various coefficients of U, are summed to produce a so-called discrepancy, $\Delta$, while the coefficients of B are shifted.

The result of step 120 is used in step 130. When $\Delta \neq 0$, $t_{max}$ multipliers scale the coefficients of the current $B^1(z)$ by $\Delta$ to produce an additive change in the coefficients of $\Lambda^1(z)$. In addition, a non-zero $\Delta$ can be inverted to produce $\Phi=1/\Delta$, the coefficients of B are loaded with the coefficients of $\Lambda^1(z)$ if a logical condition is true, and the coefficients of U are rotated.

The results of step 130 are used in step 140. If the logical condition is true, the integer j is updated and $t_{max}$ multipliers scale the coefficients of $B^{(i+1)}(z)$ by $\Phi$ to normalize them. The iteration counter i is incremented.

In step 150, i is compared to r, and if i<r, the algorithm proceeds with the next iteration, and otherwise the polynomials $\Lambda(z)$ and $B(z)$ have been determined and are output in step 160.

The roots of the polynomial $\Lambda(z)$ yield the error locations in that $$\Lambda(\alpha^{-i})=0$$

implies that the codeword symbol with index n−1−i is in error, where n is the number of symbols in the codeword. When $\Lambda(\alpha^{-i})=0$, the codeword symbol with index n−1−i is corrected by adding the error value, $$e_{(n-1-i)}=\alpha^{(-i)(r+lr0-1)}/((B(\alpha^{-i})\Lambda_{odd}(\alpha^{-i}))$$

where $\Lambda_{odd}(z)$ is the polynomial obtained from $\Lambda(z)$ by deleting all terms with even powers of z. When lr0 is chosen so that r+lr0−1 is the multiplicative order of $\alpha$ in the Galois field, the formula simplifies to $$e_{(n-1-i)}=1/((B(\alpha^{-i})\Lambda_{odd}(\alpha^{-i}))$$

A shortcoming of the algorithm as shown in FIG. 1 is that r+1 symbol storage registers are needed for B. Feng showed a method of reducing this storage as shown in the algorithm of FIG. 2.

Figure 2:
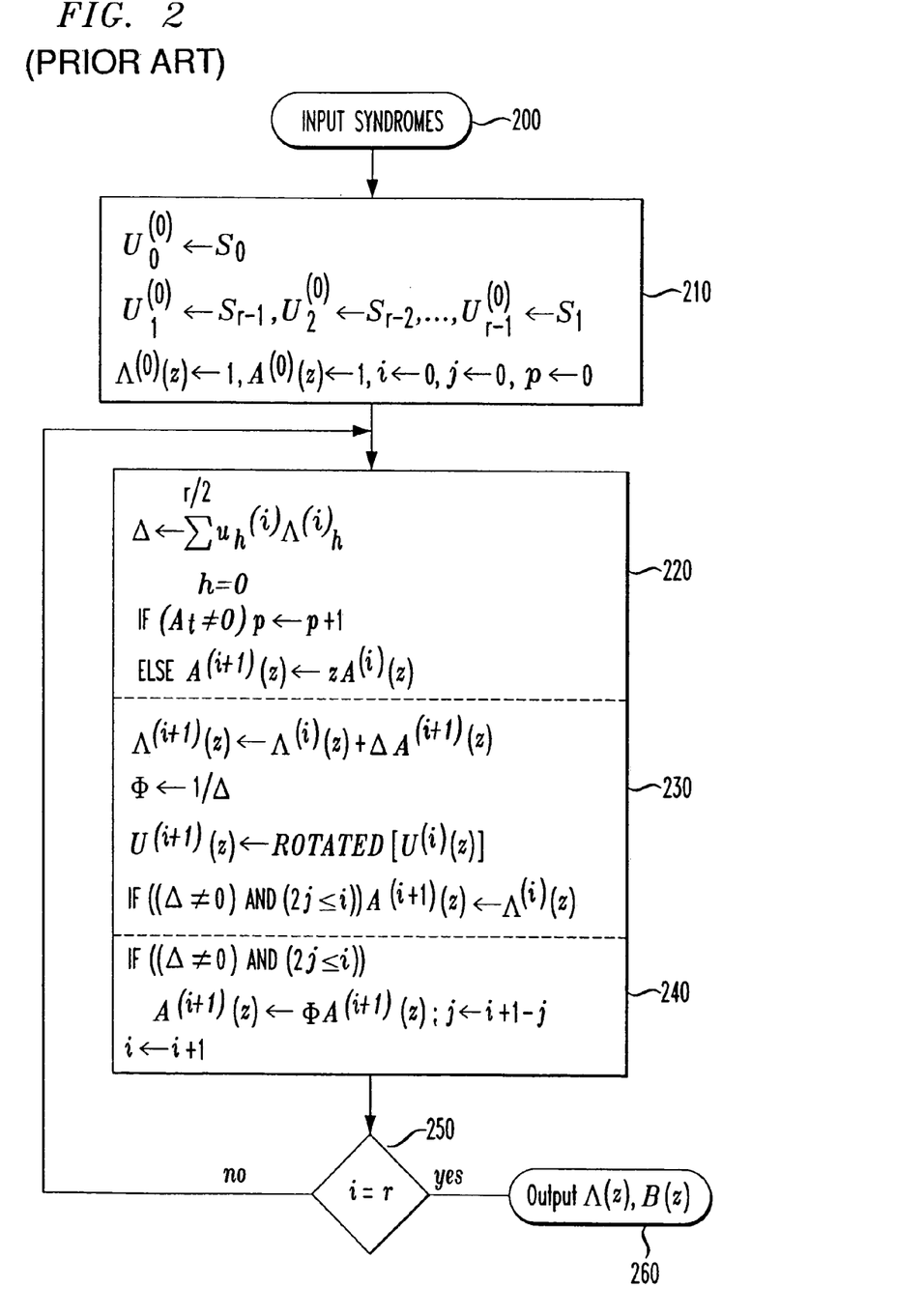
FIG. 2 shows a part of the Berlekamp-Massey algorithm used to determine a locator polynomial as modified by Feng, according to the background art.

The algorithm of FIG. 2 includes similar steps to those of FIG. 1, in that the syndromes are input in step 200, the coefficients are updated in step 210, then each iteration is carried out in steps 220, 230 and 240, step 250 determines if i=r, and if not then steps 220, 230 and 240 are repeated, and the results are output in step 260.

In FIG. 2, the polynomial A of degree at most $t_{max}$ plays a similar role to polynomial B in FIG. 1. Feng notes that at most $t_{max}$ consecutive coefficients of B are non-zero, and the new variable p counts the number of times the polynomial would have been shifted beyond the storage limits of A in FIG. 1. Assuming that at most t errors have occurred and comparing the resulting polynomials of FIGS. 1 and 2, Feng shows that the polynomial $\Lambda(z)$ is the same, and $$B(z)=z^p A(z).$$

When $\Lambda(\alpha^{-i})=0$, the codeword symbol with n−i−1 is corrected by adding the error value, $$e_{(n-1-i)}=\alpha^{(-i)(r+lr0-1)}/((\alpha^{-ip}A(\alpha^{-i})\Lambda_{odd}(\alpha^{-i}))$$

$$=\alpha^{(-i)(r+lr0-1-p)}/((A(\alpha^{-i})\Lambda_{odd}(\alpha^{-i}))$$

Figure 7A:
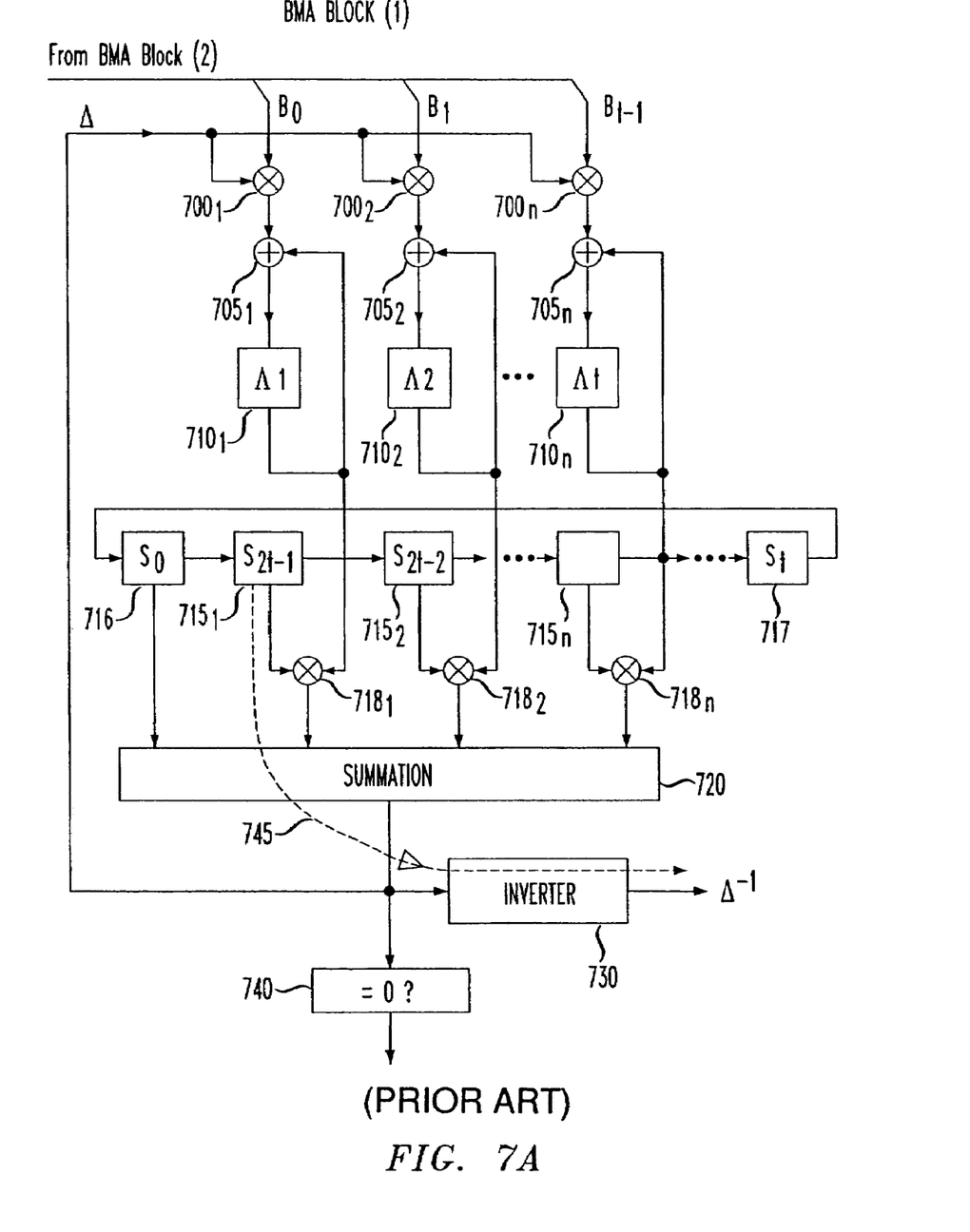
FIG. 7A is a partial view of a circuit implementation according to the background art, implementing the algorithm of FIG. 2.
Figure 7B:
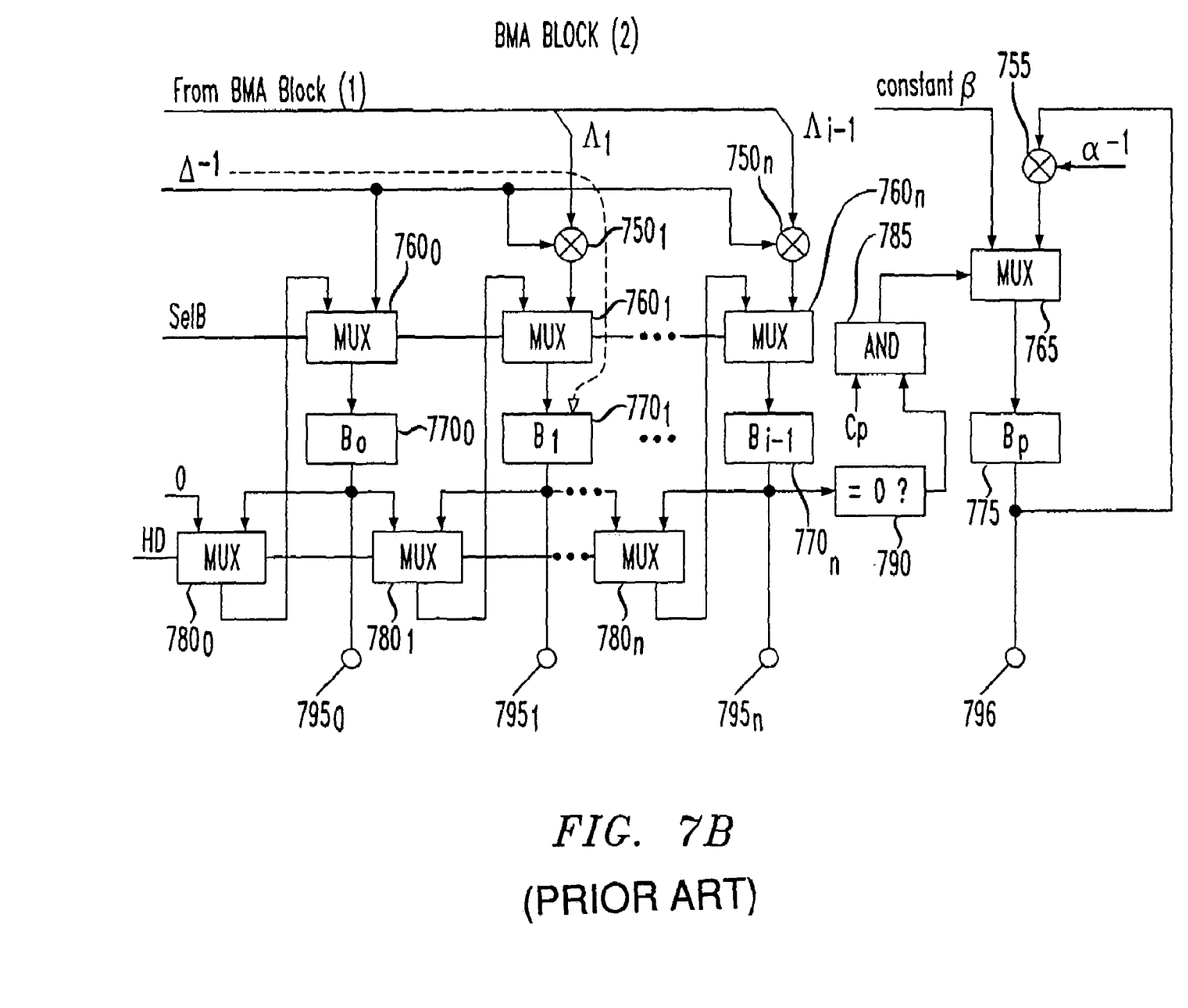
FIG. 7B is a further partial view of the background art circuit implementation according to FIG. 7A, implementing the algorithm of FIG. 2.
Figure 8A:
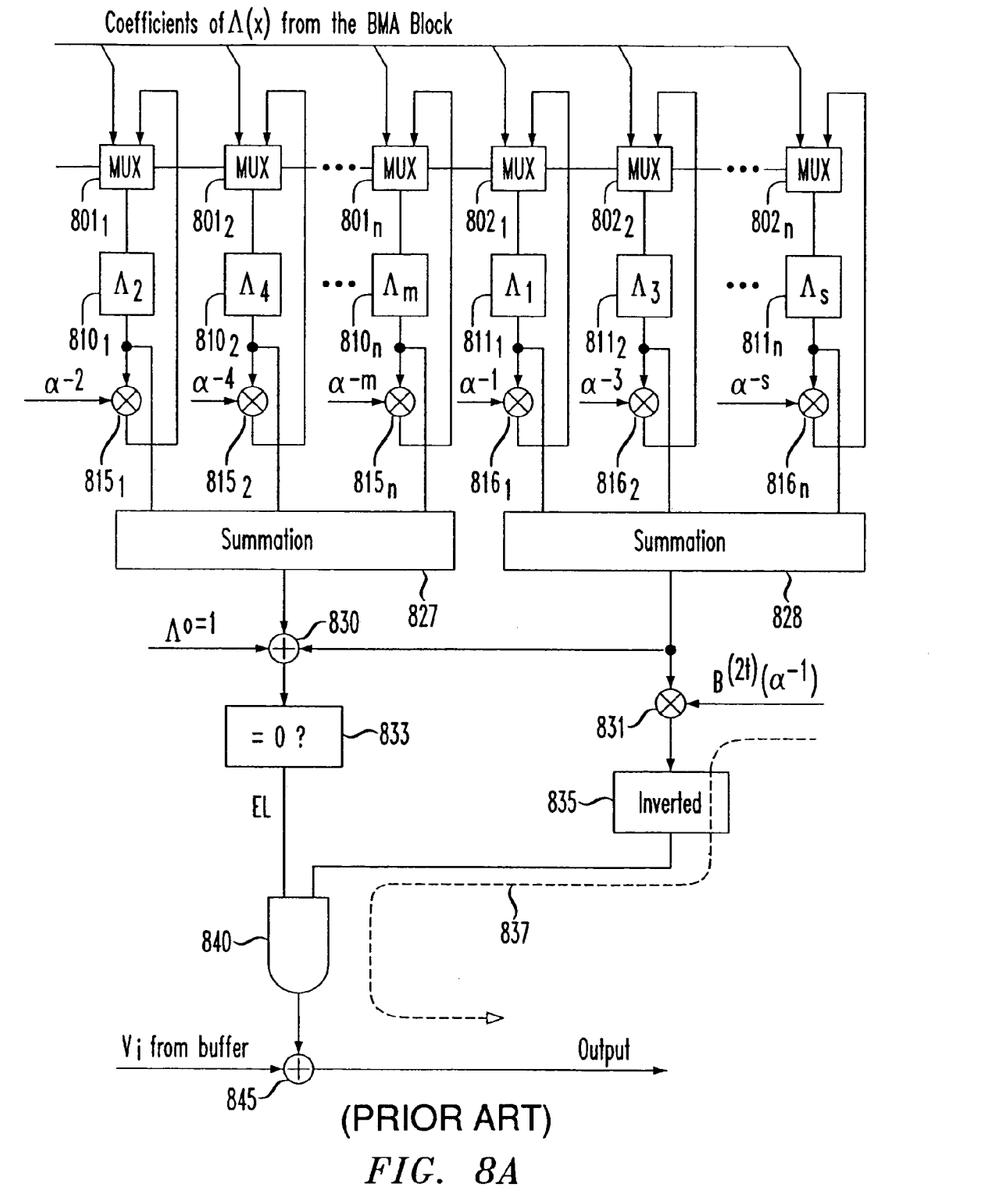
FIG. 8A is a partial view of a correction block associated with the background art circuit of FIGS. 7A and 7B.
Figure 8B:
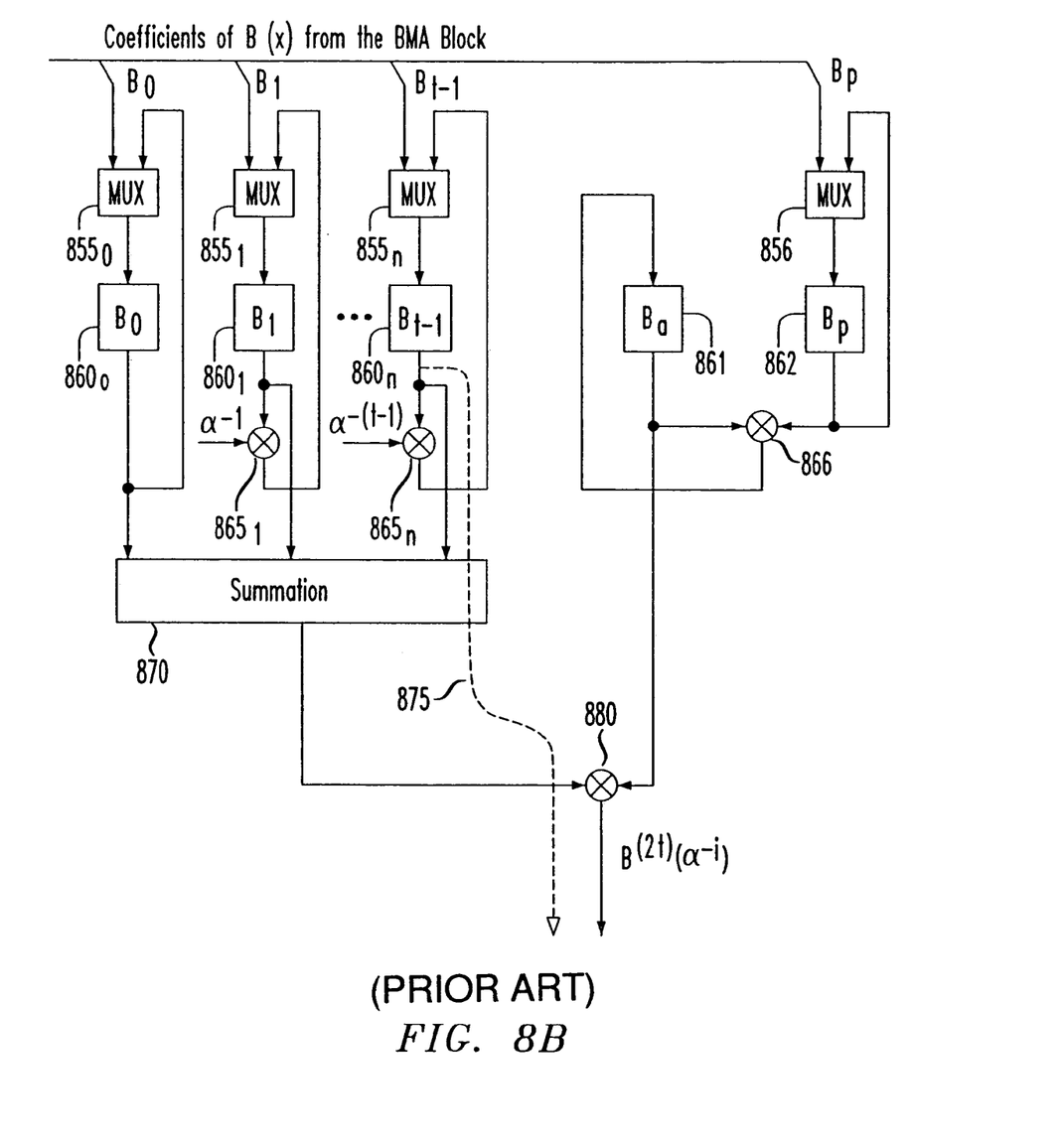
FIG. 8B is a further partial view of the correction block according to the background art.

Feng's circuit implementation is shown in FIGS. 7A, 7B, 8A and 8B. FIGS. 7A and 7B show partial views of a BMA (Berlekamp-Massey Architecture) circuit block employed to compute the error locator polynomial and the error evaluation polynomial from the output of a syndrome computation block (not shown), and FIGS. 8A and 8B show partial views of a correction circuit block that performs a Chien search and error evaluation on the output of the BMA block.

The partial view of Feng's BMA block in FIG. 7A shows multipliers $700_1, 700_2, \ldots, 700_n$ and $718_1, 718_2, \ldots, 718_n$, adders $705_1, 705_2, \ldots, 705_n$, registers $710_1, 710_2, \ldots, 710_n$, $715_1, 715_2, \ldots, 715_n$, 716 and 717, summer 720, Galois Field inverter 730 and decision block 740. The Galois field inverter 730 computes the inverse $\Delta^{-1}$ of the discrepancy $\Delta$. The multipliers $700_1, 700_2, \ldots, 700_n$ and $718_1, 718_2, \ldots, 718_n$ and adders $705_1, 705_2, \ldots, 705_n$ perform Galois field arithmetic. Multiplexers used for loading registers $715_1, 715_2, \ldots, 715_n$, 716 and 717 are omitted for clarity. Registers $715_1, 715_2, \ldots, 715_n$, 716 and 717 are initialized to be the syndromes calculated in the syndrome calculation block and registers $710_1, 710_2, \ldots, 710_n$ are initialized to be zero. A critical path is shown by the dotted line at 745.

The remaining circuitry in Feng's BMA block is shown in FIG. 7B, where $750_1 \ldots 750_n$ and 755 are multipliers, $760_0, 760_1, \ldots, 760_n$, 765 and $780_0, 780_1, \ldots, 780_n$ are multiplexers $770_0, 770_1, \ldots, 770_n$ and 775 are registers, 785 is an AND gate, and 790 is a decision block. The registers $770_1, \ldots, 770_n$ and 775 are initialized to zero, and register $770_0$ is initialized to 1. Outputs are obtained at terminals $795_0, 795_1, \ldots, 795_n$, and 796.

FIG. 8A is a partial view of the correction block according to Feng, in which $801_1, 801_2, \ldots, 801_n$ and $802_1, 802_2, \ldots, 802_n$ are multiplexers, $810_1, 810_2, \ldots, 810_n$ and $811_1, 811_2, \ldots, 811_n$ are registers, $815_1, 815_2, \ldots, 815_n, 816_1, 816_2, \ldots, 816_n$ and 831 are multipliers, 827 and 828 are summers, 830 and 845 are adders, 833 is a decision block, 835 is a Galois Field inverter, 840 is an OR gate, and 837 represents a critical path.

FIG. 8B shows recursive circuitry on the right hand side to calculate the numerator of the expression in paragraph earlier as a product of Feng's terms Ba and Bp, the recursive circuitry including a multiplexer 856, registers 861 and 862, and a multiplier 866. On the left hand side are circuits to evaluate the polynomial B(z), employing multiplexers $855_0, 855_1, \ldots, 855_n$, registers $860_0, 860_1, \ldots, 860_n$, multipliers $865_1, \ldots, 865_n$ and a summer 870. The outputs of multiplier 866 and summer 870 are then multiplied together by multiplier 880. 875 represents a critical path.

Figure 3:
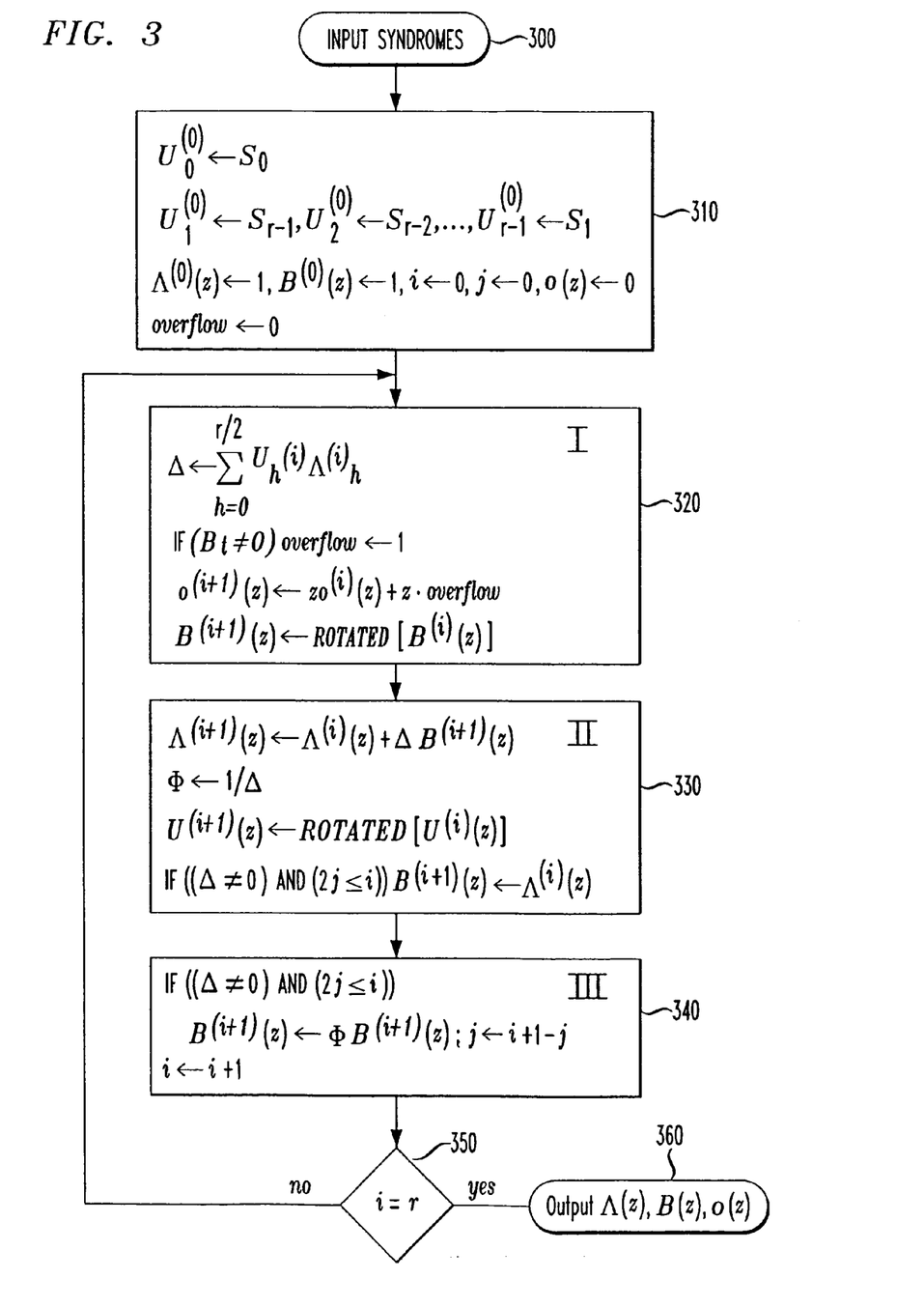
FIG. 3 shows an algorithm according to a preferred embodiment of the invention.

A preferred algorithm according to the invention is shown in FIG. 3, which is closely related to a preferred embodiment of the apparatus. The syndromes are input in step 300, and the coefficients updated in step 310. In FIG. 3, an iteration cycle of the previous algorithms has been split into three distinct steps 320, 330 and 340, each of which takes one cycle to execute. Feng's implementation requires 3t multipliers to execute steps 220, 230 and 240 within one clock cycle. By separating these steps into distinct cycles, only t multipliers are required which can be used in various ways to execute each part of the algorithm. Since these multipliers dominate the VLSI area of the PDU, the area is desirably reduced. In step 350, i is compared to r, and if i is not equal to r, then steps 320, 330 and 340 are repeated. If i=r, then the results are output in step 360.

Figure 4:
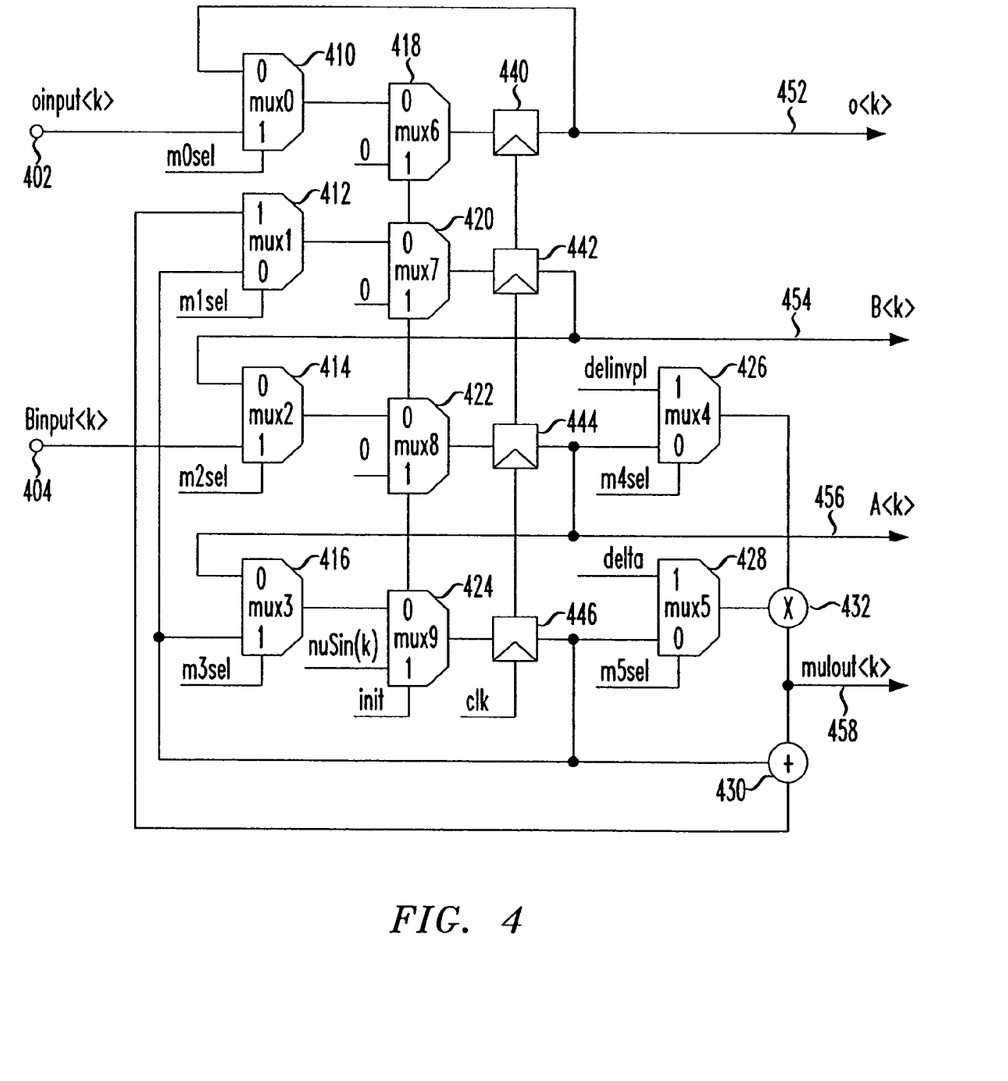
FIG. 4 shows a decoder PDU slice according to an embodiment of the invention.

In FIG. 4, the schematic of a submodule referred to as a slice is shown. The slice contains a number of two-way multiplexers 410, 412, 414, 416, 418, 420, 422, 424, 426 and 428, each having three inputs including a select input, such that when the select input is 1(0) the input 1(0) appears on the output, a Galois Field adder 430, which inputs two 8-bit quantities and outputs their finite field sum, and is equivalent to a bit-wise XOR gate, a Galois Field multiplier 432, which inputs two 8-bit quantities and outputs their finite field product, and registers 440, 442, 444 and 446, which are D-type clocked flip-flops to hold terms $\Lambda$, B, o, and U. On the rising edge of the clock signal clk the input values are stored in the flip-flops and appear at the output. The term o is an overflow flag indicating whether B(z) has overflowed, and is either 0 or 1. An o input is provided at 402, a B input at 404, an o output at 452, a B output at 454, a $\Lambda$ output at 456, and a multiplier output at 458.

In general, at the beginning of an iteration (at the start of step 320), register 446 holds a syndrome value denoted $U_j$, register 444 holds a term of the locator polynomial $\Lambda$, register 442 holds a term of the B polynomial, and register 442 holds a flag that shows if the term of the B polynomial has resulted from an overflow during rotation. Slice k holds the coefficients of $z^k$ in the polynomials B(z) and $\Lambda(z)$.

At the start of decoding, the signal init is asserted, which loads registers 440, 442, and 444 with all zeroes, and register 446 with an external syndrome term at the rising edge of the clock. All slices except for the implied first one are initialized in this way. The initial value of Λ(z) is 1, so all slices except for the implied first one are set to zero. Similarly, the initial B(z) is 1. After initialization, the signal init is reset to zero for the remainder of decoding, and 2t three-step iterations are performed to complete the decoding, where t is the maximum number of errors to be corrected.

At the start of iteration step 320, control signals m0sel, m1sel and m2sel are all asserted (set to 1), while signals m3sel, m4sel and m5sel are deasserted (set to 0). The product mulout$_k$ is the Galois field product of a term of U and a term of Λ, which is summed with all such terms from all slices in an external Galois Field adder to form the discrepancy. At the end of iteration step 320, is loaded into an external register that feeds back the registered signal to the slices. Also, at the end of the iteration step 320, the terms of the three polynomials U, B and 7 are rotated within a slice, so that the term of 7 moves to register 446, a term of B moves up to register 444, and a term of U is in register 442. The B<k> output of slice k is connected to the B$_{input}$<k+1> of slice <k+1>. As these B terms are registered, the terms of B are shifted ahead from one slice to the next, accomplishing the $$B^{(i+1)}(z) \leftarrow \text{ROTATED } [B^i(z)]$$

function. In this function, the modified B'(z) is zB(z), where the highest order term, if it overflows, is shifted back to the lowest order slice, setting the accompanying o(z) flag.

At the start of iteration step 330, control signals m1sel, m2sel and m5sel are all asserted (1), while control signals m4sel and m0sel are deasserted (0). Signal m3sel may or may not be asserted. The product mulout$_k$ is the Galois Field product of a term of B and discrepancy ). The Galois Field sum Λ$_k$⊕(ΔB$_k$) is one term of the function $$\Lambda^{(i+1)}(z) \leftarrow \Lambda^i(z) + \Delta B^{(i+1)}(z),$$

which is loaded in register 442 at the end of iteration step 330. The terms of U are shifted ahead from one slice to the next, accomplishing the function:

$$U^{(i+1)}(z) \leftarrow \text{ROTATED } [U^i(z)]$$

one of the terms of which is loaded in register 444 at the end of iteration step 330. These are shifted from one slice to the next using the same B$_{input}$<k+1> and B<k> inter-slice connections used to shift B in iteration step 320. The value in register 440 is unmodified.

Register 446 may take one of two values. This depends upon the expression:

((Δ≠0) AND (2j<=i))

in FIG. 3. An external circuit determines if any of the bits of the discrepancy are non-zero by OR-ing all the bits together. Two external quantities i and 2j are compared, and the result of the comparison is logically AND-ed with the output of the non-zero detection OR gate. This logical signal externally drives m3sel. If m3sel is asserted, the value of register 446 remains unchanged at the end of iteration step 330, and register 446 retains the unmodified term Λ$_k$, accomplishing the function:

$$B^{(i+1)}(z) \leftarrow \Lambda^i(z).$$

If m3sel is deasserted, the value of register 446 is updated at the end of iteration step 330 by taking on the value B$_k$ that was in register 444 at the end of iteration step 320. At the same time, an external circuit performs a Galois field inversion on the quantity Δ, inverts the least significant bit of the result, and loads the modified inversion, denoted delinvp1, in an external register at the end of iteration step 330. The inversion circuitry handles the case Δ=0 by loading the external register with a 1.

At the start of iteration step 340, m4sel is asserted, m0sel, m2sel, m3sel and m5sel are deasserted, and m1sel takes the same value that m3sel took in iteration step 330. The product mulout$_k$ is the Galois field product of a term of B and delinvp1. If m1sel is asserted, the input to register 442 is:

$$(delinvp1 \otimes B_k^{(i+1)}) \oplus B_k^{(i+1)} = ((\Delta^{-1} \oplus 1) \otimes B_k^{(i+1)}) \oplus B_k^{(i+1)} =$$
$$((\Delta^{-1} \otimes B_k^{(i+1)}) \oplus B_k^{(i+1)}) \oplus B_k^{(l+1)} = \Delta^{-1} \otimes B_k^{(i+1)}$$

in a field of characteristic 2 like GF(256). This accomplishes the function $$B^{(i+1)}(z) \leftarrow \Phi B^{(i+1)}(z)$$

in FIG. 3. If m1sel is deasserted, then register 442 is updated at the end of iteration step 340 by taking on the value B$_k$ that was in register 446 at the end of step 330.

Since m3sel is deasserted, register 446 takes on the value U$_k$ that was in register 444 at the end of step 330. Since m2sel is deasserted, register 444 takes on the value Λ$_k$ that was in register 442 at the end of step 330. Register 440 is unmodified.

In this manner, the updated polynomial terms B, Λ and U have returned to their original positions at the end of the three steps 320, 330 and 340 making up one iteration. After 2t such iterations, the polynomials B and Λ have taken their final values, and are used by the Chien search unit to determine error locations and values.

A unique feature of the slice shown in FIG. 4 is that the terms Λ, B, and U are contained in time-varying registers within a slice. This allows the terms which are multiplied to be shifted to the multiplier inputs as needed, so that each multiplier is shared in a high-speed implementation. It also allows for re-use of the polynomial rotation circuitry so that the terms of the B polynomial are shifted in step 320, while the terms of the U polynomial are shifted using the same circuitry in step 330.

To compare implementations, Feng's circuitry was sliced to contain one term of the equivalent Λ, A, and U and their associated logic. Table 1 compares the efficiency of the slice shown in FIG. 4 to that of Feng. Each was estimated using synthesis results for a decoder designed for 9 bit symbols. As can be observed from Table 1, Feng's implementation uses nearly twice the VLSI area, but the two implementations have nearly equal iteration delays. Hence, this improved implementation is nearly twice as efficient.

TABLE 1

Comparison of Slice Efficiency

|  | Feng | Preferred Embodiment |
|---|---|---|
| Area | 3 multipliers | 1 multiplier |
|  | 3 symbol registers | 3 symbol registers |
|  | 1 symbol adder | 1 symbol adder |
|  | 5 symbol multiplexers | 8 symbol multiplexers |
|  | (~1,270 gates) | (628 gates) |

TABLE 1-continued

Comparison of Slice Efficiency

| | Feng | Preferred Embodiment |
|---|---|---|
| Delay per iteration | 2 multiplications<br>1 large summation<br>1 inversion<br>2 multiplexings<br>1 register delay<br>1 register setup<br>(~16 ns) | 3 inversions<br><br><br><br>3 register delays<br>3 register setups<br>(~16.8 ns) |
| Product of Delay * Area | 20,320 | 10,550 |

Figure 5:
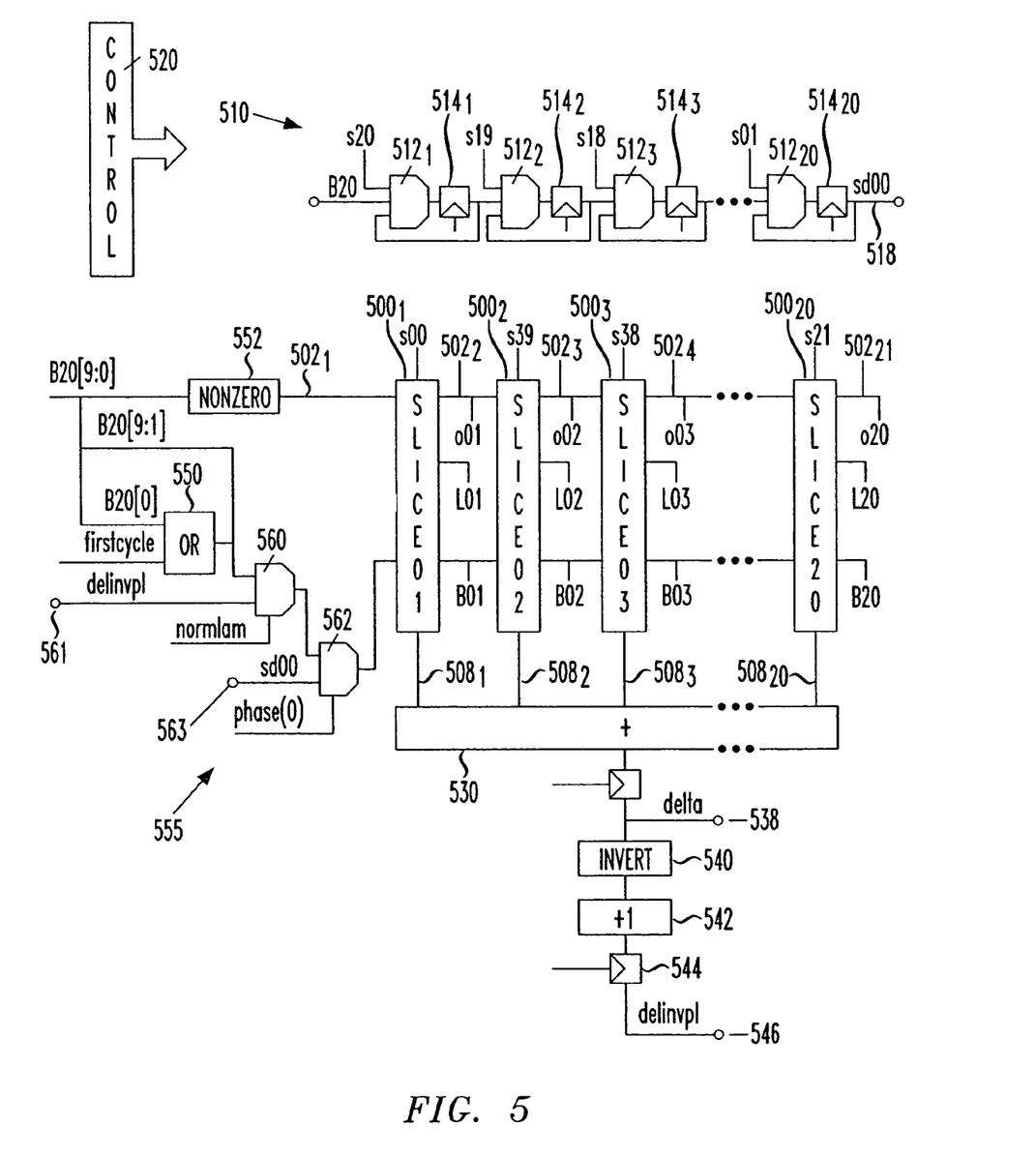
FIG. 5 is a block diagram of the PDU according to an embodiment of the invention.

FIG. 5 shows the schematic of the entire PDU according to the embodiment of FIG. 4. This particular PDU has $t^{max}=20$, and designs for other values of $t^{max}$ are easily derived by adding or deleting slices. The PDU includes a number of slices $500_1$, $500_2$, $500_3$, ... $500_{20}$, having respective o inputs $502_1$, $502_2$, $502_3$, ..., $502_{20}$ and the final slice $500_{20}$ having an o output $502_{21}$, a delay line 510 for holding half of U, control circuitry shown symbolically at 520, a summer 530, a Galois field inverter 540 for obtaining the multiplicative inverse of ), and auxiliary logic indicated generally at 555, including an OR gate 550, a decision block 552 and multiplexers 560 and 562.

Outputs $508_1$, $508_2$, $508_3$, ..., $508_{20}$ from slices $500_1$, $500_2$, $500_3$ ... $500_{20}$, corresponding to multiplier output 458 in the exemplary slice shown in FIG. 4, are summed by a summer 530, to give a value of $\Delta$ at terminal 538, which is then inverted by the Galois field inverter 540 and modified by Galois Field adder 542 to provide a value of $(1/\Delta)\rho$ 1 at 544. The register output value is fed back to multiplexer 560 at terminal 561. Delay line 510 includes multiplexers $512_1$, $512_2$, $512_3$ ... $512_{20}$, and corresponding registers $514_1$, $514_2$, $514_3$ ... $514_{20}$. The delay line 510 is shifted once very three cycles. An output 518 from the delay line 510 is supplied to input terminal 563 of multiplexer 562, where it is also combined with the output of multiplexer 560, to feed the B input 504 of the first slice $500_1$, corresponding to the B input 404 in FIG. 4. Decision block 552 detects a non-zero condition to determine the value of the o input $502_1$, to the first slice $500_1$, corresponding to the o input 402 in FIG. 4. OR gate 550 is employed to detect a first cycle condition.

The present invention also eliminates Feng's special circuit for calculating the numerator of the error value expression. To do this, the Applicants make a judicious choice of lr0 to use the simplified version of the error value expression, i.e., with numerator 1, and handle storage of the B polynomial in a proprietary fashion.

The polynomials B(z) and o(z) here are of the special form, $$B(z) = \sum_{i=1}^{t_{max}} B_i z^i \text{ and } o(z) = \sum_{i=1}^{t_{max}} o_i z^i$$

where $o_1$ is 0 or 1, and neither polynomial has a constant term. The storage of a constant term for the polynomial B(z) is not required, because initialization of B(z) is performed by the OR gate 550 in the first cycle of Berlekamp-Massey iterations, as shown in FIG. 5. For either of these polynomials, the notation $$B^{(i+1)}(z) \leftarrow \text{ROTATED } [B^i(z)]$$

indicates that the coefficients are updated in a shifting operation, with the highest degree coefficient shifting to the coefficient of z, $$B_1^{(i+1)} = B_{t_{max}}^i, B_2^{(i+1)} = B_1^i, \ldots, B_{t_{max}}^{(i+1)} = B_{(t_{max}-1)}^i$$

A non-zero coefficient in the polynomial o(z) indicates that the corresponding term of the resulting polynomial B(z) is the result of overflowing the allotted storage.

Assuming that at most t errors have occurred, the resulting polynomial $\Lambda(z)$ is identical to that of FIG. 1. If the resulting polynomial o(z) is zero, the resulting polynomial B(z) is identical to the B(z) obtained in FIG. 1. To distinguish the polynomials when o(z) is non-zero, we refer to the result of FIG. 5 as $B^{wrapped}(z)$. The resulting polynomial B(z) obtained in FIG. 1 can be related to $B^{wrapped}(z)$ in all cases as follows.

$$B_0 = B_0^{wrapped} = 0, B_1 = (1-o_1)B_1^{wrapped}, \ldots, B_{t_{max}} = (1-o_{t_{max}})B_{t_{max}}^{wrapped},$$

$$B_{(t_{max}+1)} = o_1 B_1^{wrapped}, B_{(t_{max}+2)} = o_2 B_2^{wrapped}, \ldots, B_{2(t_{max})} = o_{t_{max}} B_{t_{max}}^{wrapped}.$$

In a Chien search unit, the polynomial B(z) is typically evaluated in a circuit as shown on the left hand side of FIG. 8B, as previously discussed. A series of Chien search registers is initially loaded with the polynomial B(z). The initial sum of these registers represents the polynomial B(z) evaluated at z=1. In the next cycle, the register containing $B_1$ has been multiplied by $\forall^{-1}$. After v cycles, the sum of the registers can be expressed as $$\sum_{i=1}^{t_{max}} \alpha^{-iv} B_i = B(\alpha^{-v}).$$

Figure 6:
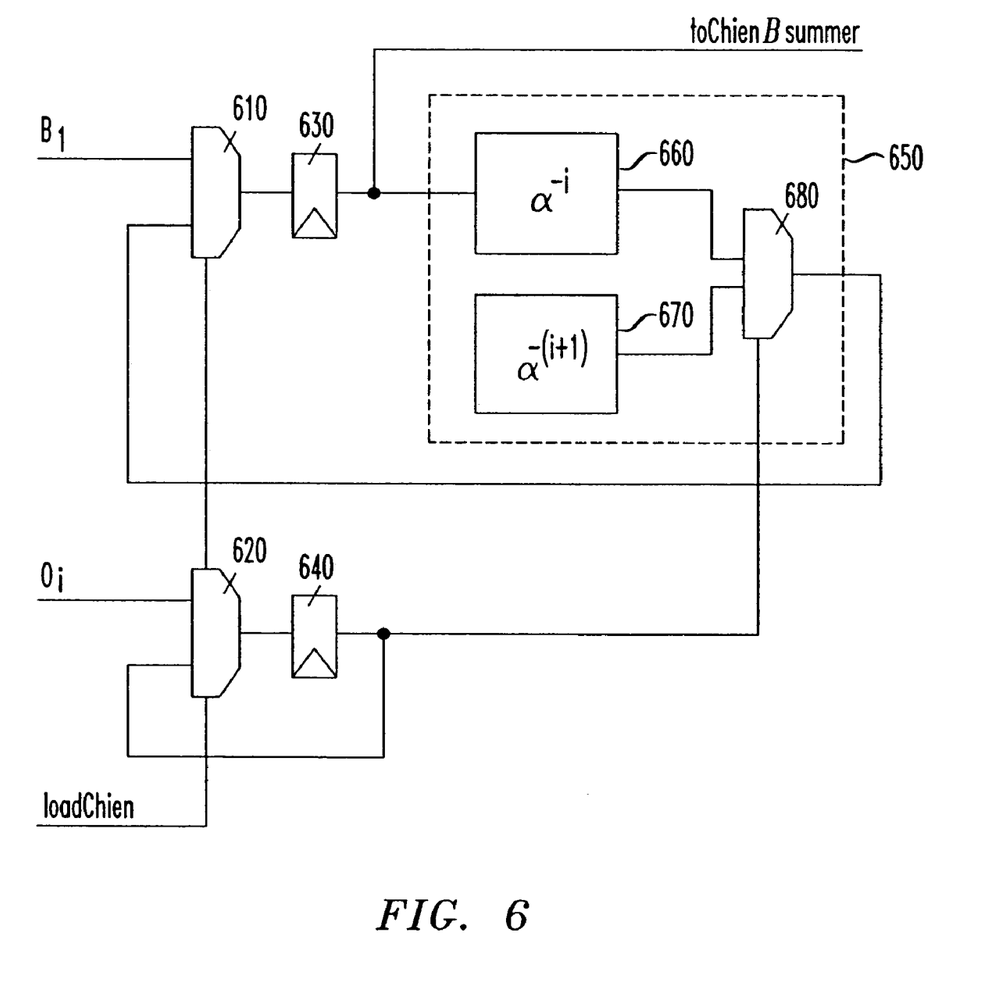
FIG. 6 shows the use of a dual multiplier circuit according to an embodiment of the invention in performing a Chien search.

In a preferred embodiment of the invention as shown in FIG. 6, a register 630 is initially loaded with $B_1$ and another one bit register 640 is loaded with the corresponding overflow flag $o_1$ via multiplexers 610 and 620 respectively. The overflow flag controls a proprietary dual-constant multiplier. If $o_1=0$, the dual-constant multiplier scales by $\alpha^{-1}$, but if $o_1=1$, the dual-constant multiplier scales by $\alpha^{-(i+tmax)}$. The net effect is to provide an equivalent evaluation to that of the polynomial B(z) in FIG. 1, while using only half the B storage registers of FIG. 1. This special circuitry allows us to eliminate two random multipliers in Feng's numerator circuit of FIG. 8B. Although we picture the contents of the dashed box 650 in FIG. 6 as two distinct multipliers 660 and 670 followed by a multiplexer 680 for clarity of understanding, in practice the two multipliers 660 and 670 share a lot of common terms, and are described in such a way as to exploit the commonality and reduce complexity. In Appendix A, a typical single and dual multiplier description is shown in Verilog.

While the invention has been described with reference to the exemplary embodiments thereof, those skilled in the art will be able to make various modifications to the described embodiments of the invention without departing from the true spirit and scope of the invention.

APPENDIX A

Example Single and Dual Multipliers in Verilog

```
Description: multiply by alpha**1003 = alpha**(-20) in GF(1024)
module mula1003(inp, outp);
input [9:0] inp;
output [9:0] outp;
reg [9:0] outp;
always @(inp)
begin
outp[0] = inp[1] ^ inp[4] ^ inp[5] ^ inp[7];
outp[1] = inp[0] ^ inp[1] ^ inp[4] ^ inp[6] ^ inp[7];
outp[2] = inp[3] ^ inp[6] ^ inp[7] ^ inp[9];
outp[3] = inp[2] ^ inp[3] ^ inp[6] ^ inp[8] ^ inp[9];
outp[4] = inp[1] ^ inp[4] ^ inp[7] ^ inp[8] ^ inp[9];
outp[5] = inp[0] ^ inp[1] ^ inp[5] ^ inp[6] ^ inp[7] ^ inp[8];
outp[6] = inp[0] ^ inp[1] ^ inp[3] ^ inp[6] ^ inp[9];
outp[7] = inp[0] ^ inp[2] ^ inp[3] ^ inp[7] ^ inp[8] ^ inp[9];
outp[8] = inp[2] ^ inp[3] ^ inp[5] ^ inp[8];
outp[9] = inp[2] ^ inp[4] ^ inp[5] ^ inp[9];
end
endmodule
Description: multiply by alpha**1003 or alpha**(983) in GF(1024)
Note that common terms are labelled cm and shared
p0 are remaining terms for alpha**1003, p1 are remaining for
alpha**(983)
module duala1003or983(inp, select, outp);
input [9:0] inp;
input select;
output [9:0] outp;
reg [9:0] outp;
reg [9:0] p0;
reg [9:0] p1;
reg [9:0] cm;
always @(inp)
begin
p0[0] = inp[4] ^ inp[7];
p0[1] = inp[1] ^ inp[6] ^ inp[7];
p0[2] = inp[6] ^ inp[9];
p0[3] = inp[3] ^ inp[8] ^ inp[9];
p0[4] = inp[1];
p0[5] = inp[0] ^ inp[1] ^ inp[7];
p0[6] = inp[0] ^ inp[3];
p0[7] = inp[2] ^ inp[3] ^ inp[9];
p0[8] = inp[2] ^ inp[5];
p0[9] = inp[4] ^ inp[5];
p1[0] = inp[0] ^ inp[2] ^ inp[3] ^ inp[8];
p1[1] = inp[2] ^ inp[5] ^ inp[9];
p1[2] = inp[1] ^ inp[2] ^ inp[4] ^ inp[5];
p1[3] = inp[0] ^ inp[1] ^ inp[4] ^ inp[7];
p1[4] = inp[2] ^ inp[6];
p1[5] = inp[3];
p1[6] = inp[4] ^ inp[8];
p1[7] = inp[1] ^ inp[5];
p1[8] = inp[0] ^ inp[1] ^ inp[6];
p1[9] = inp[0] ^ inp[3] ^ inp[7];
cm[0] = inp[1] ^ inp[5];
cm[1] = inp[0] ^ inp[4];
cm[2] = inp[3] ^ inp[7];
cm[3] = inp[2] ^ inp[6];
cm[4] = inp[4] ^ inp[7] ^ inp[8] ^ inp[9];
cm[5] = inp[5] ^ inp[6] ^ inp[8];
cm[6] = inp[1] ^ inp[6] ^ inp[9];
cm[7] = inp[0] ^ inp[7] ^ inp[8];
cm[8] = inp[3] ^ inp[8];
cm[9] = inp[2] ^ inp[9];
end
```

What is claimed is:

1. A decoder for error correcting codes, comprising:
a syndrome calculation circuit; and
a polynomial determining unit for calculating polynomials from an output of said syndrome calculation circuit, said polynomials including at least one polynomial that is rotated if said at least one polynomial overflows, said polynomial determining unit comprising:
a plurality of slices, each of said plurality of slices being employed to calculate one coefficient of each of said polynomials in each of a plurality of clock cycles; and
a single multiplier employed in each of said plurality of slices;
wherein each of said plurality of slices is employed a plurality of times in successive clock cycles to determine a plurality of coefficients of each of said polynomials.

2. The decoder for error correcting codes according to claim 1, wherein:
said at least one of said polynomials is a scratch polynomial employed in an intermediate step.

3. The decoder for error correcting codes according to claim 2, wherein:
said single multiplier is employed in three successive clock cycles to determine said polynomials.

4. The decoder for error correcting codes according to claim 1, wherein said decoder further comprises:
a correction circuit for evaluating an error evaluation polynomial.

5. The decoder for error correcting codes according to claim 4, wherein said correction circuit comprises:
a first multiplier employed when a scratch polynomial has overflowed; and
a second multiplier different from the first multiplier employed when said scratch polynomial has not overflowed.

6. A correction circuit for a decoder for error correcting codes, comprising:
a correction circuit to evaluate an error evaluation polynomial, said correction circuit comprising:
a first multiplier employed when a scratch polynomial has overflowed, and
a second multiplier different from the first multiplier employed when said scratch polynomial has not overflowed.

7. A method of decoding error correcting codes, comprising:
calculating a plurality of syndromes;
calculating a plurality of polynomials from said calculated plurality of syndromes;
rotating at least one of said calculated plurality of polynomials if said at least one of said calculated plurality of polynomials overflows;
calculating one coefficient of each of said polynomials in each of a plurality of clock cycles;
performing a single multiplying step in calculating each said coefficient; and
performing each said multiplying step a plurality of times in successive clock cycles to determine a plurality of coefficients of each of said polynomials.

8. The method of decoding error correcting codes according to claim 7, wherein:
said at least one of said polynomials is a scratch polynomial employed in an intermediate step.

9. The method of decoding error correcting codes according to claim 8, wherein:
said step of multiplying is performed in three successive clock cycles to determine said polynomials.

10. The method of decoding error correcting codes according to claim 7, further comprising:
calculating error evaluation coefficients of an error evaluation polynomial;

multiplying each of said error evaluation coefficients by a first factor if each said error evaluation coefficient has overflowed; and multiplying each of said error evaluation coefficients by a second factor different from said first factor if each said error evaluation coefficient has not overflowed;

whereby said error evaluation polynomial is evaluated.

11. A method of correcting errors for decoding error correcting codes, comprising:

calculating an error evaluation polynomial comprising a plurality of coefficients;

multiplying each of said plurality of coefficients of said error evaluation polynomial by a first factor if each said coefficient has overflowed; and multiplying each of said plurality of coefficients of said error evaluation polynomial by a second factor different from said first factor if each said coefficient has not overflowed;

whereby said error evaluation polynomial is evaluated.

12. Apparatus for decoding error correcting codes, comprising:

means for calculating a plurality of syndromes;

means for calculating a plurality of polynomials from said calculated plurality of syndromes;

means for rotating at least one of said calculated plurality of polynomials if said at least one of said calculated plurality of polynomials overflows;

means for calculating one coefficient of each of said polynomials in each of a plurality of clock cycles;

means for performing a single multiplying step in calculating each said coefficient; and means for performing each said multiplying step a plurality of times in successive clock cycles to determine a plurality of coefficients of each of said polynomials.

13. The apparatus for decoding error correcting codes according to claim 12, wherein:

said at least one of said polynomials is a scratch polynomial employed in an intermediate step.

14. The apparatus for decoding error correcting codes according to claim 13, wherein:

said means for performing a single multiplying step multiplies in three successive clock cycles to determine said polynomials.

15. The apparatus for decoding error correcting codes according to claim 12, further comprising:

means for calculating error evaluation coefficients of an error evaluation polynomial;

means for multiplying each of said error evaluation coefficients by a first factor if each said error evaluation coefficient has overflowed; and means for multiplying each of said error evaluation coefficients by a second factor different from said first factor if each said error evaluation coefficient has not overflowed;

whereby said error evaluation polynomial is evaluated.

* * * * *